(12) United States Patent
Hata et al.

(10) Patent No.: US 7,173,333 B2
(45) Date of Patent: Feb. 6, 2007

(54) SEMICONDUCTOR DEVICE

(75) Inventors: Toshiyuki Hata, Maebashi (JP);
Takamitsu Kanazawa, Takasaki (JP);
Takeshi Otani, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 45 days.

(21) Appl. No.: 10/972,410

(22) Filed: Oct. 26, 2004

(65) Prior Publication Data
US 2005/0121777 A1    Jun. 9, 2005

(30) Foreign Application Priority Data
Dec. 3, 2003   (JP) .............................. 2003-404762

(51) Int. Cl.
H01L 23/34    (2006.01)
H01L 23/495   (2006.01)
H01L 29/80    (2006.01)
H01L 31/0328  (2006.01)

(52) U.S. Cl. ...................... 257/713; 257/666; 257/281; 257/183

(58) Field of Classification Search ................ 257/685, 257/777, 723, 724, 699, 712, 713, 281, 282, 257/183, 734, 666, 690
See application file for complete search history.

(56) References Cited

U.S. PATENT DOCUMENTS
6,677,669 B2 *  1/2004  Standing ..................... 257/685

FOREIGN PATENT DOCUMENTS
JP           2000-217416          8/2000

* cited by examiner

Primary Examiner—Chuong Anh Luu
(74) Attorney, Agent, or Firm—Mattingly, Stanger, Malur & Brundidge, .P.C.

(57) ABSTRACT

A semiconductor device includes: a package; two semiconductor chip fixing parts located adjacently to each other in the package; and first and the second semiconductor chips, each of which is fixed on the semiconductor chip fixing part and has a field effect transistor formed therein. A gate lead G1, a source lead S1, and a drain lead D2 are arranged from left to right on the first surface of the package and a drain lead D1, a source lead S2, and a gate lead G2 are arranged from left to right on the second surface. A gap between the source lead S1 and the drain lead D2 is two times a gap between the gate lead G1 and the source lead S1, and a gap between the drain lead D1 and the source lead S2 is two times a gap between the source lead S2 and the gate lead G2.

20 Claims, 14 Drawing Sheets

SEMICONDUCTOR DEVICE

BACKGROUND OF THE INVENTION

1. Field of the Invention

The present invention relates to a semiconductor device and an electronic device and a technology effectively applied to, for example, a semiconductor device that has a plurality of semiconductor chips, each of which has a transistor formed therein, in a package and has a high breakdown voltage.

2. Description of the Related Art

As one of the semiconductor devices has been known a semiconductor device having a structure (so-called SOP8 type) in which two semiconductor chips each having a transistor formed therein is mounted in a package and in which four leads are protruded from each side of one pair of sides opposite to each other of the package (for example, JPA-2000-217416).

A plurality of power MOS FETs are used for a motor control, a power supply, and the like. A composite power MOS FET (transistor) studied by the inventors includes two power MOS FETs. FIGS. 21 to 24 are illustrations related to a conventional semiconductor device 80 in which two power MOS FETs (transistors) are packaged in a single package.

The semiconductor device 80, as shown in a schematic plan view in FIG. 21 and in a schematic sectional view in FIG. 23, outwardly, has a structure in which four leads 82 are protruded in a gullwing shape from each side of one pair of sides (long sides) opposite to each other of a flat and square package 81. In FIG. 21, the leads 82 are denoted by reference numerals from 1 to 8 as lead terminal numbers. These reference numerals are thought to be arranged anti-clockwise along the periphery of the package. That is, a shown in FIG. 21, the leads 82 are denoted along the lower side of the package 81 from the left to the right by the reference numerals 1 to 4 and are denoted along the upper side from the right to the left by the reference numerals 5 to 8.

For example, a lead located at a lead terminal 1 is a source electrode terminal (S1). Similarly, a lead terminal 2 is a gate electrode terminal (G1) and lead terminals 8 and 7 are drain electrode terminals (D1) and construct, for example, the terminals of a switching transistor, respectively. Further, a lead terminal 3 is a source electrode terminal (S2) and a lead terminal 4 is a gate electrode terminal (G2) and lead terminals 6, 5 are drain terminals (D2) and construct, for example, the terminals of a rectifier transistor. Here, the arrangement of the lead terminal numbers is the same also in the description of the invention.

FIG. 22 is a schematic plan view to show in a transparent state a semiconductor chip fixing part, a semiconductor chip and leads in the package 81. As shown in FIG. 22, the leads 82 of the lead terminals 8, 7 are formed in a structure in which they are coupled to a semiconductor chip fixing part 85 located in the package 81 and shaped like a square. Further, the lead terminals 1, 2 opposite to the lead terminals 8, 7 are formed independently of each other. The tip, that is, the inner end of the independent lead 82 is formed into a wire bonding pad 86 having a wide width so as to enable wire bonding. A semiconductor chip 90 is fixed via a conductive adhesive 87 to the top surface of the semiconductor chip fixing part 85 (see FIG. 23). This semiconductor chip 90 has a vertically structured power MOSFET formed therein and has a gate electrode pad 91 and a source electrode pad 92 formed on its top surface and has a drain electrode formed on its bottom surface. Hence, the semiconductor chip 90 is fixed to the semiconductor chip fixing part 85 with the conductive adhesive 87, whereby the leads 82 of the lead terminals 8, 7 construct drain terminals (D1). The wire bonding pad 86 of the lead terminal 1 and the source electrode pad 92 of the semiconductor chip 90 are electrically connected to each other by a plurality of conductive wires 93. The wire bonding pad 86 of the lead terminal 2 and the gate electrode pad 91 of the semiconductor chip 90 are electrically connected to each other by a conductive wire 93. In this manner, a switching transistor is formed.

Further, similarly, as shown in FIG. 22, the leads 82 of the lead terminals 6, 5 are formed in a structure in which they are coupled to a semiconductor chip fixing part 95 located in the package 81 and shaped like a square. Further, the lead terminals 3, 4 opposite to the lead terminals 6, 5 are formed independently of each other. The tip, that is, the inner end of the independent lead 82 is formed into a wire bonding pad 86 having a wide width so as to enable wire bonding. A semiconductor chip 96 is fixed via a conductive adhesive (not shown) to the top surface of the semiconductor chip fixing part 95. This semiconductor chip 96 has a vertically structured power MOSFET formed therein and has a gate electrode pad 97 and a source electrode pad 98 formed on its top surface and has a drain electrode formed on its bottom surface. Hence, the semiconductor chip 90 is fixed to the semiconductor chip fixing part 95 with the conductive adhesive, whereby the leads 82 of the lead terminals 6, 5 construct drain terminals (D2). The wire bonding pad 86 of the lead terminal 3 and the source electrode pad 98 of the semiconductor chip 96 are electrically connected to each other by a plurality of conductive wires 93. The wire bonding pad 86 of the lead terminal 4 and the gate electrode pad 97 of the semiconductor chip 90 are electrically connected to each other by a conductive wire 93. In this manner, a rectifier transistor is formed.

The semiconductor 80 like this, shown in FIG. 24, is mounted on a mounting board 100. That is, the mounting portions at the tips of the leads 82 protruding from both sides of the package 81 are mounted via an adhesive such as solder (not shown) to respective lands 101 formed on the top surface of the mounting board 100.

For example, the width a of a lead is 0.4 mm, the pitch b of the lead is 1.27 mm, a gap c between the leads is 0.87 mm, the width f of a land is 0.76 mm, a gap g between the lands is 0.51 mm.

In this kind of semiconductor device in current use, a breakdown voltage is as low as, for example, 250 V or less and mainly of 30 V class. On the other hand, depending on a field where a semiconductor device is used, a semiconductor device having a higher breakdown voltage is desired. For example, the above-described semiconductor device mounted with two transistor chips is required to have a breakdown voltage as high as 600 V. However, in now-available products, a gap between neighboring leads is as narrow as 0.87 mm and it turned out that the increasing of the breakdown voltage of the product results in increasing a potential that a short circuit might develop between the leads of neighboring transistors and hence in making it impossible to provide a high breakdown voltage by the present structure.

According to the studies by the inventor, it turned out that in the package, the respective leads are covered with resin, which is a main constituent material of the package, and hence can secure a comparatively high breakdown voltage but that in the portions where leads protrude from the package (side portions of the package), a discharge phenomenon develops between the neighboring leads to cause a short circuit between the leads as a result.

SUMAMRY OF THE INVENTION

An object of the invention is to increase the breakdown voltage of a semiconductor device mounted with a plurality of semiconductor chips each having a transistor formed therein and the breakdown voltage of an electronic device including the semiconductor device.

Another object of the invention is to provide a semiconductor device mounted with a plurality of semiconductor chips each having a transistor formed therein and having a small size and a high breakdown voltage and an electronic device including the semiconductor device.

The above-described objects and the other objects and new features of the invention will be clear from the description and the accompanying drawings of the present specification.

The brief description of the outlines of typical inventions of the inventions disclosed in this application will be provided as follows.

A semiconductor device (1) in accordance with the invention includes:

a first semiconductor chip that includes a transistor;

a second semiconductor chip that includes a transistor;

a package that packages the first and the second semiconductor device;

a first lead that is electrically connected to a first electrode on the top surface of the first semiconductor chip and protrudes from a first surface (first side surface) which is a side surface of the package;

a second lead that is electrically connected to a control electrode on the top surface of the first semiconductor chip and protrudes from the first surface of the package and is adjacent to the first lead;

a third lead that is electrically connected to a second electrode provided on the bottom surface of the opposite surface of the top surface of the first semiconductor chip and protrudes from a second surface (second side surface) opposite to the first surface;

a fifth lead that is electrically connected to a first electrode on the top surface of the second semiconductor chip and protrudes from a second surface of the package;

a sixth lead that is electrically connected to a control electrode on the top of the second semiconductor chip and protrudes from the second surface of the package and is adjacent to the fourth lead; and a seventh lead that is electrically connected to a second electrode on the bottom surface of the opposite surface of the top surface of the second semiconductor chip and protrudes from the first surface of the package, and is characterized:

in that arrangement positions of lead terminals 1 to 4 where four leads are arranged at predetermined intervals are thought on the first surface of the package, in that arrangement positions of lead terminals 8 to 5 arranged opposite to the lead terminals 1 to 4 are thought on the second surface of the package, in that the third lead is located at the lead terminal 1, in that the fifth lead is located at the lead terminal 3, in that the sixth lead is located at the lead terminal 4, in that the seventh lead is located at the lead terminal 5, in that the first lead is located at the lead terminal 7, and in that the second lead is located at the lead terminal 8.

Further, a gap between the semiconductor chip fixing part and the respective leads whose tips face the semiconductor chip fixing part is as wide as from 0.3 mm to 0.7 mm. A transistor of each of the first semiconductor chip and the second semiconductor chip is a power field effect transistor. The first electrode is a source electrode and the second electrode is a drain electrode and the control electrode is a gate electrode.

The brief description of the advantages provided by the typical inventions of the inventions disclosed in this application will be provided as follows.

According to the above-described means (1), (a) the means (1) has a structure in which the third lead (drain lead) of the first semiconductor chip protrudes from the second surface of the package and in which the seventh lead (drain lead) of the second semiconductor chip protrudes from the first surface of the opposite surface of the second surface of the package; further, since a lead is not arranged at the position of a lead terminal 6 between the first lead (source lead) of the first semiconductor chip of the package and the seventh lead (drain lead) of the second semiconductor chip, a gap between the first lead (source lead) and the seventh lead (drain lead) becomes wide; still further, since a lead is not arranged at the position of a lead terminal 2 between the third lead (drain lead) of the first semiconductor chip and the fifth lead (source lead) of the second semiconductor chip, a gap between the third lead (drain lead) and the fifth lead (source lead) becomes wide. With these, it is possible to prevent a short circuit from developing between the drain lead and the source lead adjacent to the drain lead and hence to increase the dielectric strength of the transistor formed in the first and the second semiconductor chip. For example, it is possible to make the dielectric strength between the source and the drain as large as the vicinity of 600 V.

(b) The gap between the semiconductor chip fixing part and the respective leads whose tips face the semiconductor chip fixing part is as wide as from 0.3 mm to 0.7 mm. Hence, this can increase the dielectric strength of resin filled in the gap and forming the package. Therefore, it is possible to provide a semiconductor device having a high dielectric strength.

DETAILED DESCRIPTION OF THE INVENTION

Hereafter, the preferred embodiments of the invention will be described in detail with reference to the drawings. Here, throughout the drawings to describe the preferred embodiments of the invention, parts having the same functions are denoted by the same reference symbols and their repeated descriptions will be omitted.

[Embodiment 1]

In this embodiment will be described an example of applying the invention to a semiconductor device having a construction in which two semiconductor chips (the first semiconductor chip and the second semiconductor chip) each having a transistor formed therein are packaged in a single package. In this embodiment 1, an example of a semiconductor chip having a vertical type power MOSFET formed therein will be described. The semiconductor device like this can be used as a constituent part of, for example, a DC-DC converter circuit. Of the two transistors (the first transistor and the second transistor), one is a switching transistor and the other is a rectifier transistor.

Figure 8:
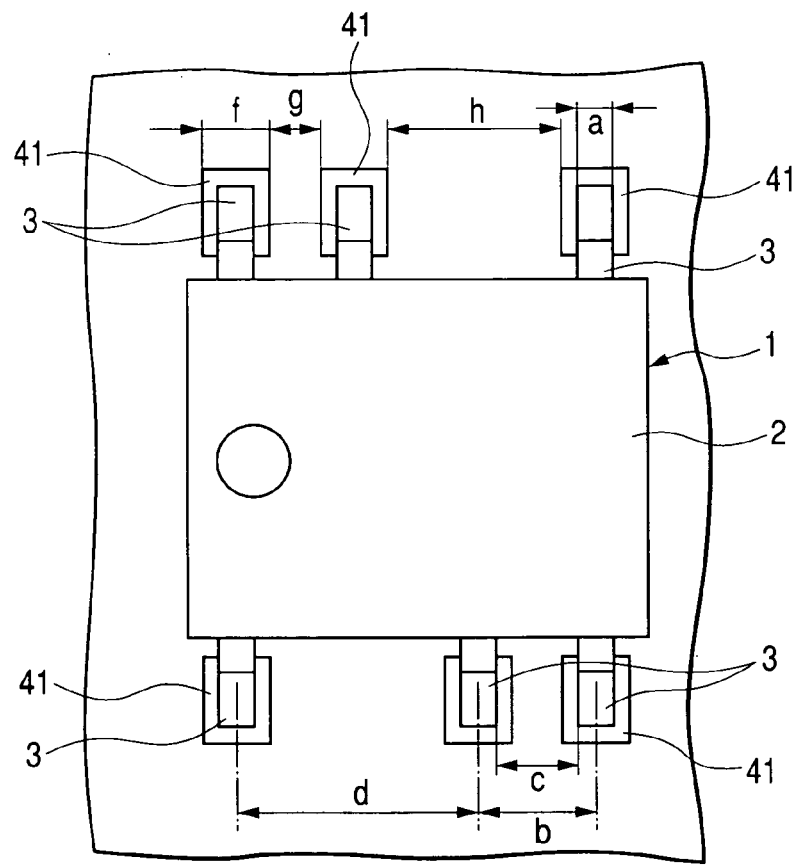
FIG. 8 is a schematic plan view to show a state where a semiconductor device of embodiment 1 is mounted on a mounting board.
Figure 9:
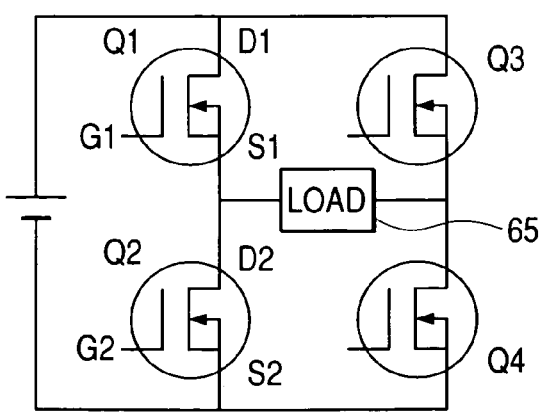
FIG. 9 is a bridge circuit diagram of an electronic device in which a semiconductor device of embodiment 1 is built.

FIGS. 1 to 14 are illustrations related to a semiconductor device of this embodiment 1. FIGS. 1 to 7 are illustrations related to the structure of the semiconductor device. FIG. 8 is an illustration to shown a mounting state. FIG. 9 is a bridge circuit diagram in which the semiconductor device of this embodiment 1 is used. FIGS. 10 to 13 are illustrations related to a method of manufacturing the semiconductor device. Further, FIG. 14 is a schematic view to show a semiconductor device of a modification of this embodiment 1.

Figure 2:
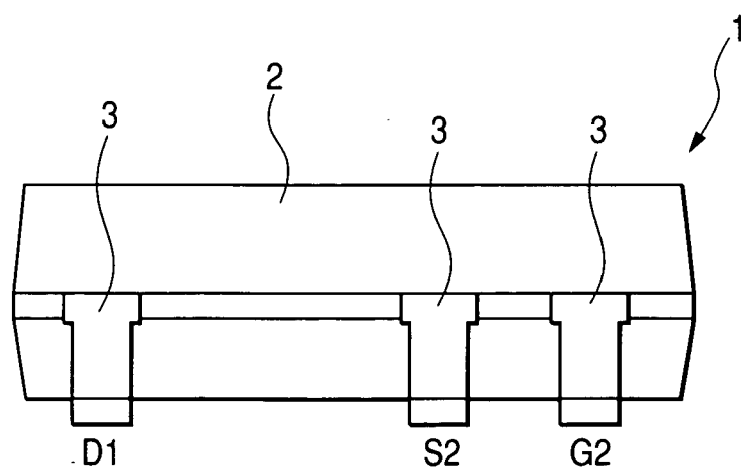
FIG. 2 is a front view of the semiconductor device.
Figure 3:
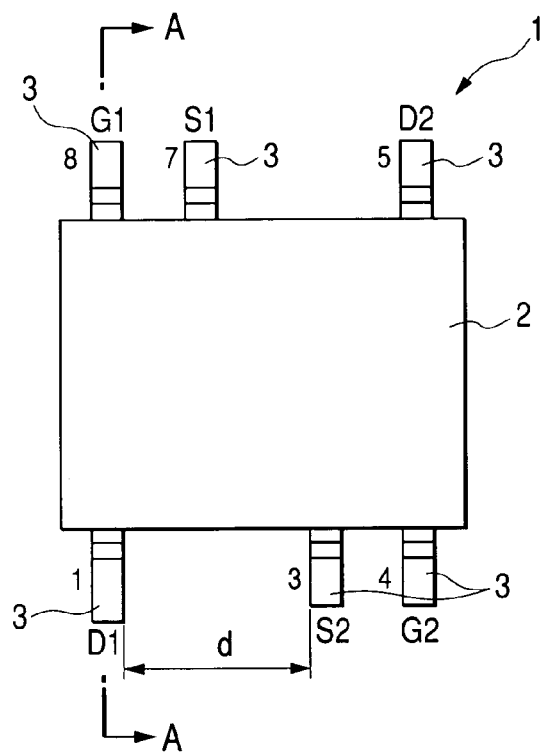
FIG. 3 is a plan view of the semiconductor device.
Figure 4:
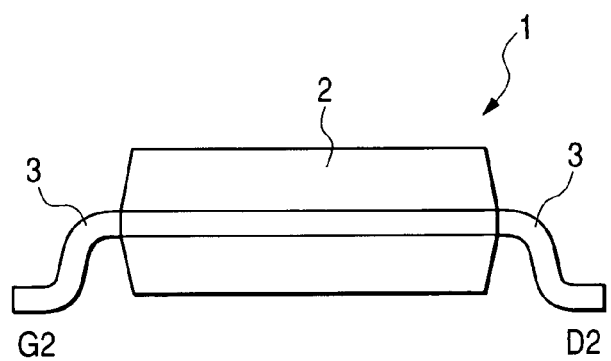
FIG. 4 is a side view of the semiconductor device
Figure 5:
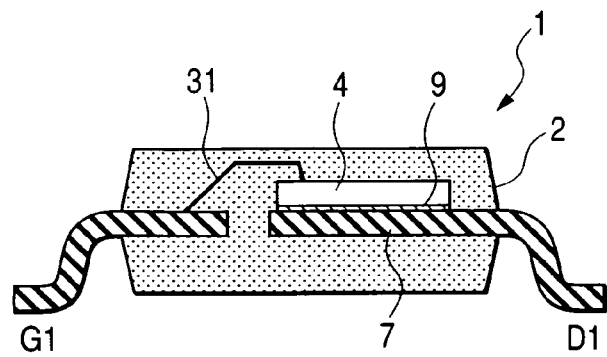
FIG. 5 is a sectional view along a line A—A in FIG. 3.

A semiconductor device 1 of this embodiment 1, as shown in FIGS. 2 to 4, outwardly, includes a package 2 and a plurality of leads 3 protruding from each of one pair of side surfaces opposite to each other of this package 2. The package 2 is formed of an insulating resin, for example, epoxy resin and is flat and square in a plan. The package 2 is rectangular and has leads 3 protruding respectively from the long sides. The lead 3 is formed in the shape of gull wings (see FIG. 5) and the semiconductor device 1 is formed in a surface mount structure.

Figure 1:
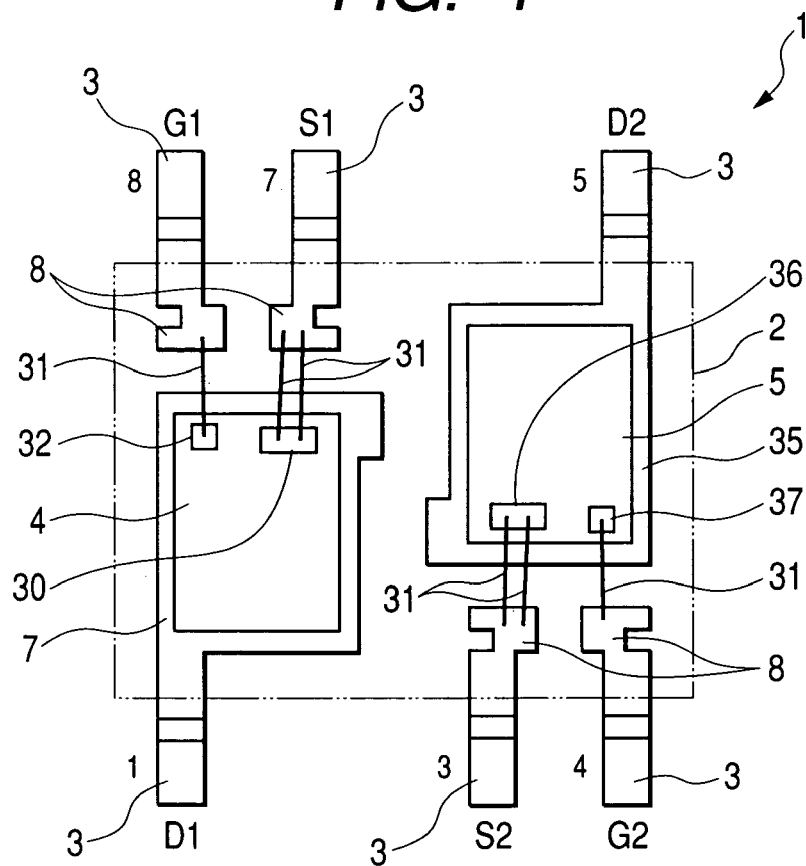
FIG. 1 is a schematic plan view to show in a transparent state semiconductor chips and inner leads in a package in a semiconductor device of embodiment 1 of the invention.

Positions where the lead terminals are arranged in both sides of the package 2 are determined. Hence, as shown in FIG. 1 and FIG. 3, positions where the leads 3 are arranged are denoted by the lead terminal numbers from 1 to 8. This embodiment 1 is of a toothless structure in which the leads are not provided at the positions of lead terminals 2, 6. The lead terminals are denoted anticlockwise along the periphery of the package by the lead terminal number numbers from 1 to 8. That is, as shown in FIG. 1, the lead terminals are denoted from the left to the right along the lower long side of the package 2 by the lead terminal numbers from 1 to 4 and from the right to the left along the upper long side by the lead terminal numbers from 5 to 8. In the drawing, lead terminal numbers 2, 6 are not shown because no lead is arranged at the portions corresponding to leads 2, 6.

In this embodiment 1, as shown in FIG. 1, the package 2 has two semiconductor chips 4, 5. A vertical type power MOSFET is formed in each of these semiconductor chips 4, 5. Here, a semiconductor chip having a vertical type power MOSFET formed therein and a cell (MOSFET) constructing the vertical type power MOSFET will be described with reference to FIG. 6 and FIG. 7. In this regard, FIG. 6 and FIG. 7 will be described by the use of symbols different from those in FIG. 1 and the like.

Figure 7:
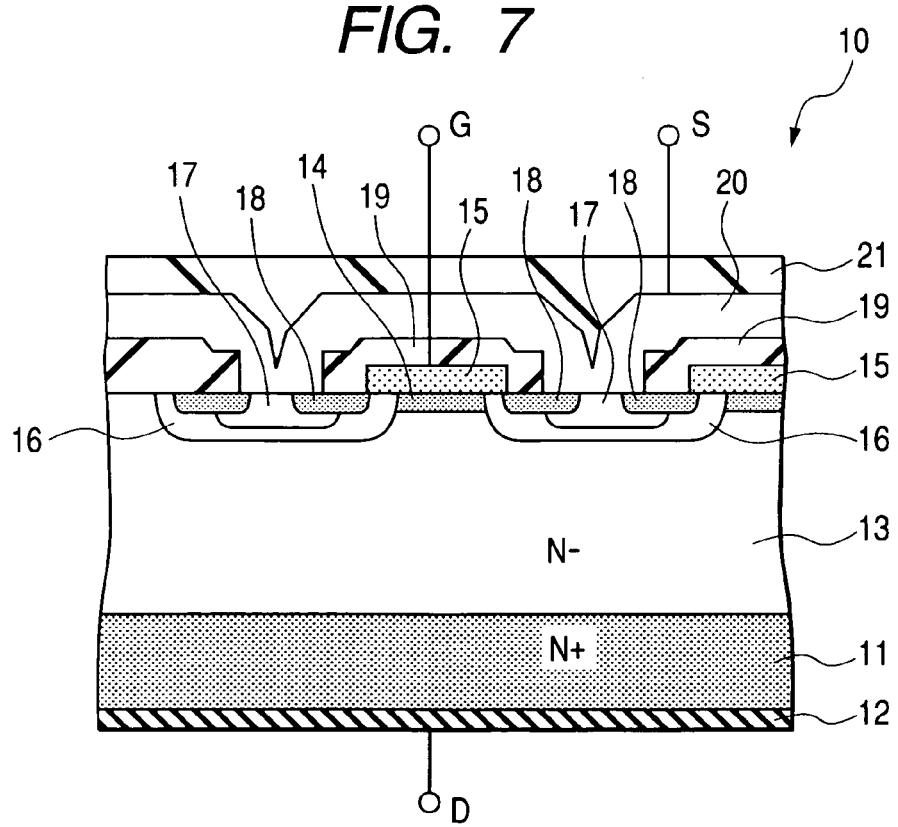
FIG. 7 is a schematic enlarged sectional view to show a portion of the semiconductor chip.

A vertical type MOSFET is formed in the semiconductor chip 10 and, as shown in FIG. 7, a drain electrode 12 is formed as a bottom surface electrode on the bottom surface of a semiconductor board 11 made of a first conduction type (N type) silicon (Si). A first conduction type (N type) epitaxial layer 13 is formed over the main surface of the semiconductor board 11. Gate electrodes 15 each formed made of a polysilicon film having a thickness of about several hundreds nm are selectively formed on the surface of the epitaxial layer 13 via a gate insulating film 14 made of a $SiO_2$ film and having a thickness of about several hundreds nm.

Further, a second conduction type (P type) low impurity concentration layer 16, a $P^+$ type high impurity concentration layer 17, and an $N^+$ type source region 18, which are formed by ion implantation and annealing, are formed in the surface portion of the epitaxial layer 13. The low impurity concentration layer 16 becomes a channel layer (base layer). With this, an N-channel type MOSFET can be formed.

On the other hand, the top surface and side surface of the gate electrode 15 are covered with an insulating film 19 made of a $SiO_2$ film or the like. A source electrode 20 is formed across a predetermined region on the surface of the exposed epitaxial layer 13 and the insulating film 19. The high impurity concentration layer 17 and the source region 18 surrounding this high impurity concentration layer 17 are exposed from the insulating film 19, so that they are electrically connected to the source electrode 20. Further, the main surface of the semiconductor board 11 including the source electrode 20 is covered with an insulating film 21. By removing the insulating film 21 partially to form openings, a source electrode pad 23 and a gate electrode pad 24 electrically connected to the gate electrode 15 are formed as shown in FIG. 6.

Figure 6:
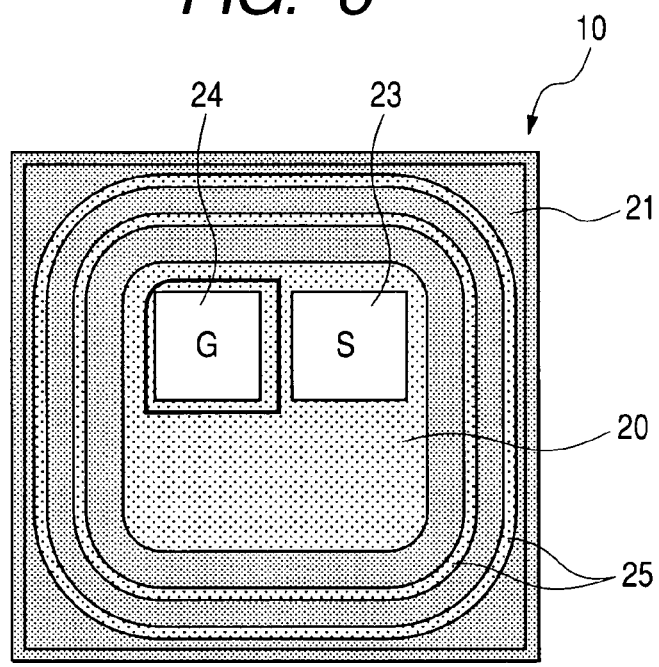
FIG. 6 is a schematic enlarged plan view of a semiconductor chip arranged in a package of the semiconductor device.

FIG. 6 is a plan view of the semiconductor chip 10 and is an illustration to show schematically the source electrode 20, the source electrode pad 23, and the gate electrode pad 24. Two protection ring electrodes 25 of high breakdown voltage are formed outside the source electrode 20 in such a way as to surround the source electrode 20. A portion except for the source electrode pad 23 and the gate electrode pad 24 is covered with the insulating film 21. The semiconductor chip 10 like this is used in this embodiment 1.

In the semiconductor device 1 of this embodiment 1, as shown in FIG. 1, a drain lead (D1: third lead) is protruded at the position of the lead terminal 1, a source lead (S1: first lead) is protruded at the position of the lead terminal 7, and a gate lead (G1: second lead) is protruded at the position of the lead terminal 8. In the drain lead (D1), a portion located in the package 2 is connected to a semiconductor chip fixing part (first chip mounting part) 7 mounted with the first semiconductor chip 4 and having a large area. A semiconductor chip 4 is fixed to the top surface of the semiconductor chip fixing part 7 via a conductive adhesive 9 (see FIG. 5). With this, the drain electrode on the bottom surface of the semiconductor chip 4 is electrically connected to the drain lead D1.

Further, the tip of the source lead S1 (first lead) and the tip of the gate lead G1 (second lead) face the periphery of the semiconductor chip fixing part 7. Each of the tip portions inserted into the package 2 of the source lead S1 and the gate lead G1 are formed so as to have a depression and a protrusion, thereby being provided with a wire bonding pad 8 having an enlarged width. The depression and the protrusion engage with resin forming the package 2 to make the lead 3 hard to withdraw. Further, the enlarging of the width of the wire bonding pad 8 can secure an area necessary for connecting a wire.

The source electrode pad 30 on the main surface of the semiconductor chip 4 is electrically connected to the wire bonding pad 8 of the source lead S1 with a plurality of conductive wires 31. Further, the gate electrode pad 32 is electrically connected to the wire bonding pad 8 of the gate lead G1 with a conductive wire 31. The source lead S1, the gate lead G1, and the drain lead D1 construct the respective terminals of the first transistor, for example, a switching transistor.

Further, as shown in FIG. 1, a drain lead (D2: seventh lead) is protruded at the position of the lead terminal 5, a source lead (S2: fifth lead) is protruded at the position of the lead terminal 3, and a gate lead (G2: sixth lead) is protruded at the position of the lead terminal 4. In the drain lead (D2), a portion located in the package 2 is connected to a semiconductor fixing part (second chip mounting part) 35 mounted with the second semiconductor chip 5 and having a large area. The semiconductor chip 5 is fixed to the top surface of the semiconductor chip fixing part 35 via a conductive adhesive (not shown). With this, the drain electrode on the bottom surface of the semiconductor chip 5 is electrically connected to the drain lead D2.

Further, the tips of the source lead S2 and the gate lead G2 face the periphery of the semiconductor chip fixing part 35. The tip portions inserted into the package 2 of the source lead S2 and the gate lead G2 are formed so as to have a depression and a protrusion, thereby being provided with a wire bonding pad 8 having an enlarged widths. The depression and the protrusion engage with resin forming the package 2 to make the lead 3 hard to withdraw. Further, the enlarging of the width of the wire bonding pad 8 can secure an area necessary for connecting a wire.

The source electrode pad 36 on the main surface of the semiconductor chip 5 is electrically connected to the wire bonding pad 8 of the source lead S2 with a plurality of conductive wires 31. Further, the gate electrode pad 37 is electrically connected to the wire bonding pad 8 of the gate lead G2 with a conductive wire 31. The source lead S2, the gate lead G2, and the drain lead D2 construct the respective terminals of the second transistor, for example, a rectifier transistor.

In this embodiment 1, the vertical type power MOSFET formed in the first and second semiconductor chips 4, 5 has a breakdown voltage of 600 V. Hence, to increase the breakdown voltage of the resin, the gap between the semiconductor chip fixing part 7 and the tips located in the package 2 of the source lead S1 and the gate lead G1 and the periphery of the semiconductor chip fixing part 7 are made larger from about 0.2 mm in a conventional semiconductor chip to about 0.7 mm to enhance the breakdown voltage of the resin. Further, similarly, the gap between the semiconductor chip fixing part 35 and the tips located in the package 2 of the source lead S2 and the gate lead G2 and the periphery of the semiconductor chip fixing part 35 are made larger from about 0.2 mm in a conventional semiconductor chip to about 0.7 mm to enhance the breakdown voltage of the resin.

Further, to prevent a short circuit from developing between the first transistor and the second transistor, the gap between the semiconductor chip fixing part 7 and the semiconductor chip fixing part 35 is also increased from about 0.2 mm in a conventional semiconductor chip to about 0.4 mm. Here, in this embodiment 1, the sides opposite to each other of the semiconductor chip fixing part 7 and the semiconductor chip fixing part 35 are stepped in the direction of the side, respectively. These are pressing portions to prevent the semiconductor chip fixing part 7 and the semiconductor chip fixing part 35 from being raised at the time of wire bonding.

FIG. 8 is an illustration to show a plane state where the semiconductor device 1 of this embodiment 1 is mounted on a mounting board 40. That is, mounting portions at the tips of the leads 3 protruding from both sides of the package 2 are mounted on the respective lands 41 formed on the top surface of the mounting board 40 via an adhesive (not shown) such as solder.

For example, the width a of the lead is 0.4 mm, the pitch b of the lead is 1.27 mm, a gap c between the leads is 0.87 mm, the width f of the land is 0.76 mm, a gap g between the lands is 0.51 mm. Further, the pitch d of neighboring leads 3 at a toothless portion is 2.14 mm and a gap h between the neighboring lands 41 at the toothless portion is 1.78 mm.

Figure 10:
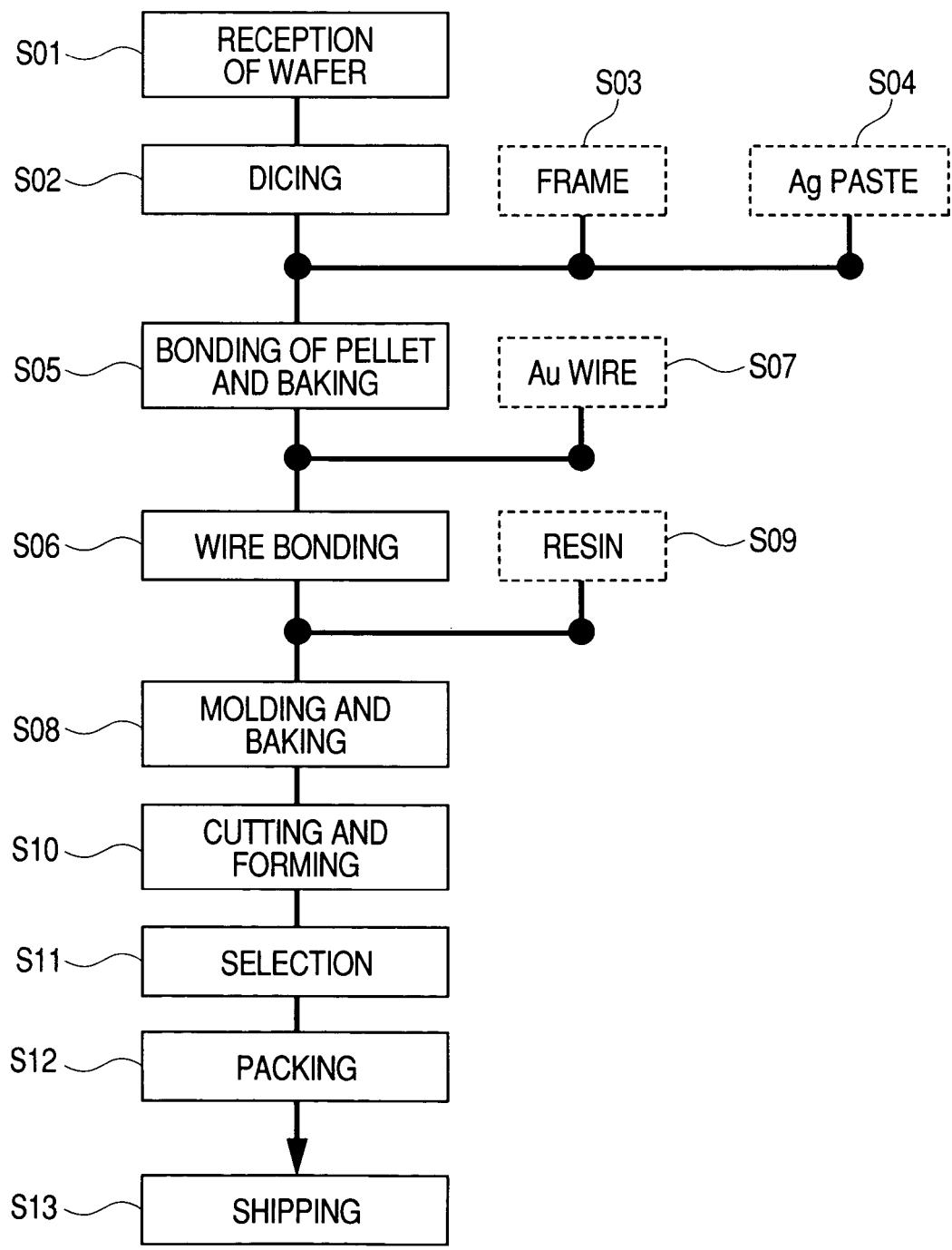
FIG. 10 is a flow chart to show a method of manufacturing a semiconductor device of embodiment 1.

FIG. 10 is a bridge circuit diagram in an electronic device using the semiconductor device 1 of this embodiment 1. This circuit diagram is a full bridge circuit and uses four transistors Q1 to Q4 as transistors. All of these transistors are n-channel type MOSFETs. This circuit is commonly used in such a way that a load 65 is controlled by a longitudinal combination of the transistors Q1+Q2 or Q3+Q4. In this case, the terminals across which high voltage (100 V or more) is not placed are G1-S1 and G2-S2 and high voltage is placed across the other terminals. Hence, the semiconductor device 1 of this embodiment 1 can be used for the longitudinal connection circuit portions of the transistors Q1 and Q2. This circuit can be suitably used for a motor inverter. While a full bridge construction is shown in FIG. 9, the semiconductor device 1 of this embodiment 1 can be also used for a circuit of half bridge construction.

Next, a method of manufacturing the semiconductor device 1 of this embodiment 1 will be described in brief. As shown by a flow chart in FIG. 10, a wafer having a vertical type power MOSFET formed thereon is prepared (reception of wafer: S01). Next, the wafer is divided by dicing to form a semiconductor chip (dicing: S02). Further, at this stage, a lead frame used for manufacturing the semiconductor device 1 is prepared (frame: S03) and a Ag paste is prepared (Ag paste: S04).

Next, the semiconductor chip is fixed to the semiconductor chip fixing part of the lead frame with the Ag paste (adhesive) and then the Ag paste is baked, thereby being hardened (bonding of pellet and baking: S05).

Next, wire bonding is performed to connect the source lead to the source electrode pad with a wire and to connect the gate lead to the gate electrode pad with a wire (wire bonding: S06). At this time, an Au wire is prepared (Au wire: S07)

Next, a package is formed by a transfer molding (molding and baking: S08). At this time, a predetermined resin for sealing is prepared (resin: S09). The package is formed by the transfer molding and then a processing of hardening the resin is performed.

Next, the unnecessary portions of the lead frame are cut and removed and the leads protruding from the package are formed in the shape of gull wings (cutting and forming: S10).

Next, products are selected (S11) and good products are packed (S12) and are shipped (S13).

Figure 11:
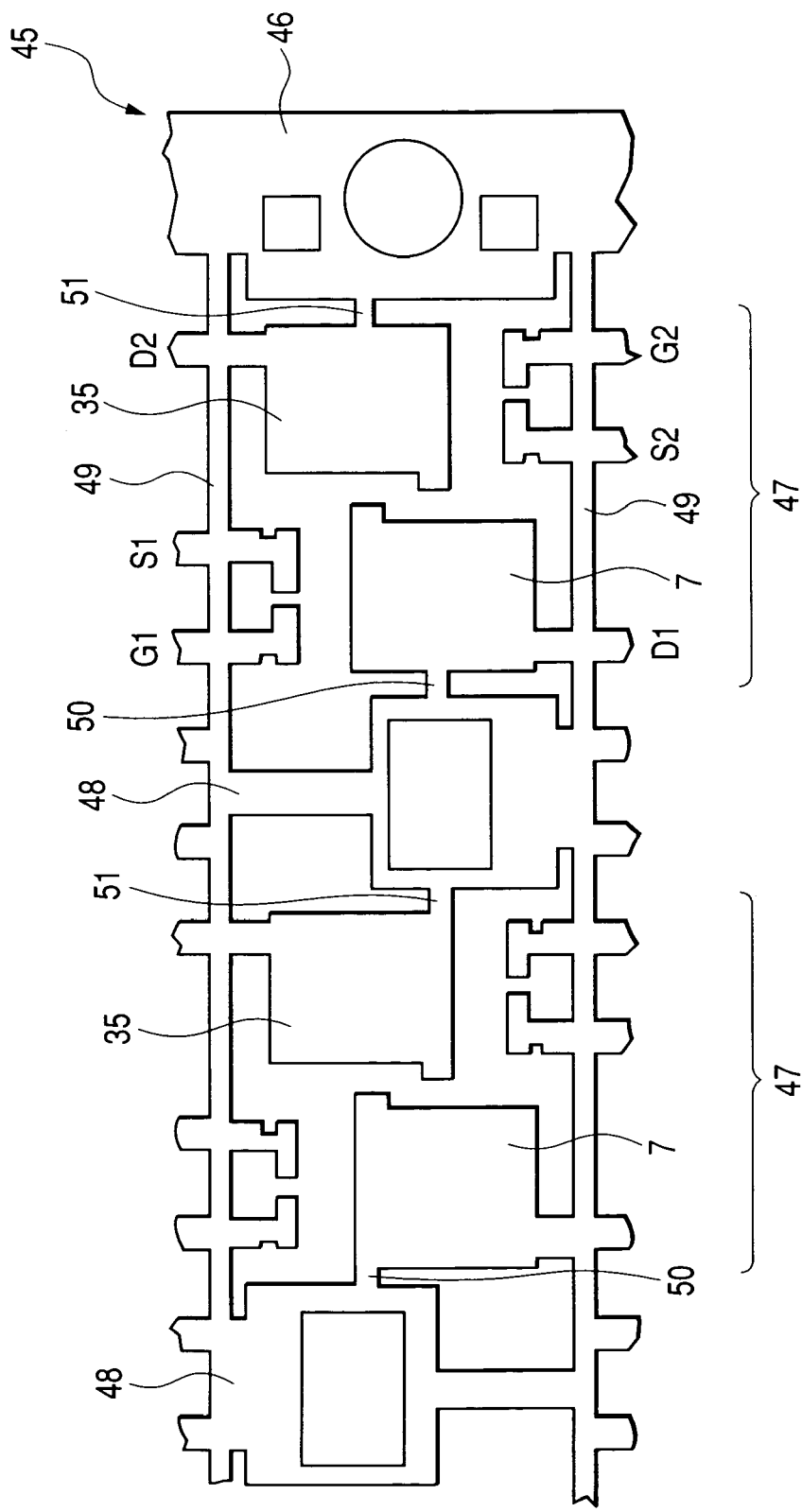
FIG. 11 is a plan view to show a portion of a lead frame used in the manufacturing of the semiconductor device.

Here, referring to FIGS. 11 to 13, a stage of fixing the semiconductor chip to the lead frame and performing wire bonding to form a package will be described. In the manufacturing of the semiconductor device 1, a lead frame 45 shown in FIG. 11 is used. This lead frame is such that a thin metal sheet (for example, made of copper alloy) having a thickness of about 0.2 mm is formed into a predetermined shape and has a structure in which a plurality of lead patterns are arranged side by side. The lead frame is formed in the shape of a rectangle formed of a pair of lateral frames and a pair of longitudinal frames. In FIG. 11, a pair of lateral frames, a left longitudinal frame, and a portion extending from the left longitudinal frame are omitted; and a right longitudinal frame 46, two dam pieces 49 extending in parallel from the right longitudinal frame 46, and connection parts 48 for connecting a pair of dam pieces 49 at predetermined intervals are shown. One lead pattern 47 is formed between the longitudinal frame 46 and a connection part 48 and one lead pattern 47 is formed also between the connection part 48 and the connection part 48. One semiconductor device 1 is manufactured by each lead pattern 47.

In each lead pattern 47, three leads 3 are arranged on each dam piece 49. This lead 3 has the same pattern as that in FIG. 1. Further, the above-described semiconductor chip fixing parts 7, 35 are connected to the tip portions (inner end portions) of the predetermined leads 3. Further, a slender support piece 50 protruding from the outer periphery of the semiconductor chip fixing part 7 is connected to and supported by the connection part 48 and a slender support piece 51 protruding from the outer periphery of the semiconductor chip fixing part 35 is connected to and supported by the connection part 48 or the longitudinal frame 46. The leads 3 extending from the dam piece 49 are connected to the lateral frame (not shown). The leads 3 in this region extend in parallel to the longitudinal frame 46. Further, a predetermined coating film is formed on the surface thereof, if necessary. The lead frame 45 has a thickness of, for example, 0.2 mm and the sizes of the respective patterns are those described above.

Figure 12:
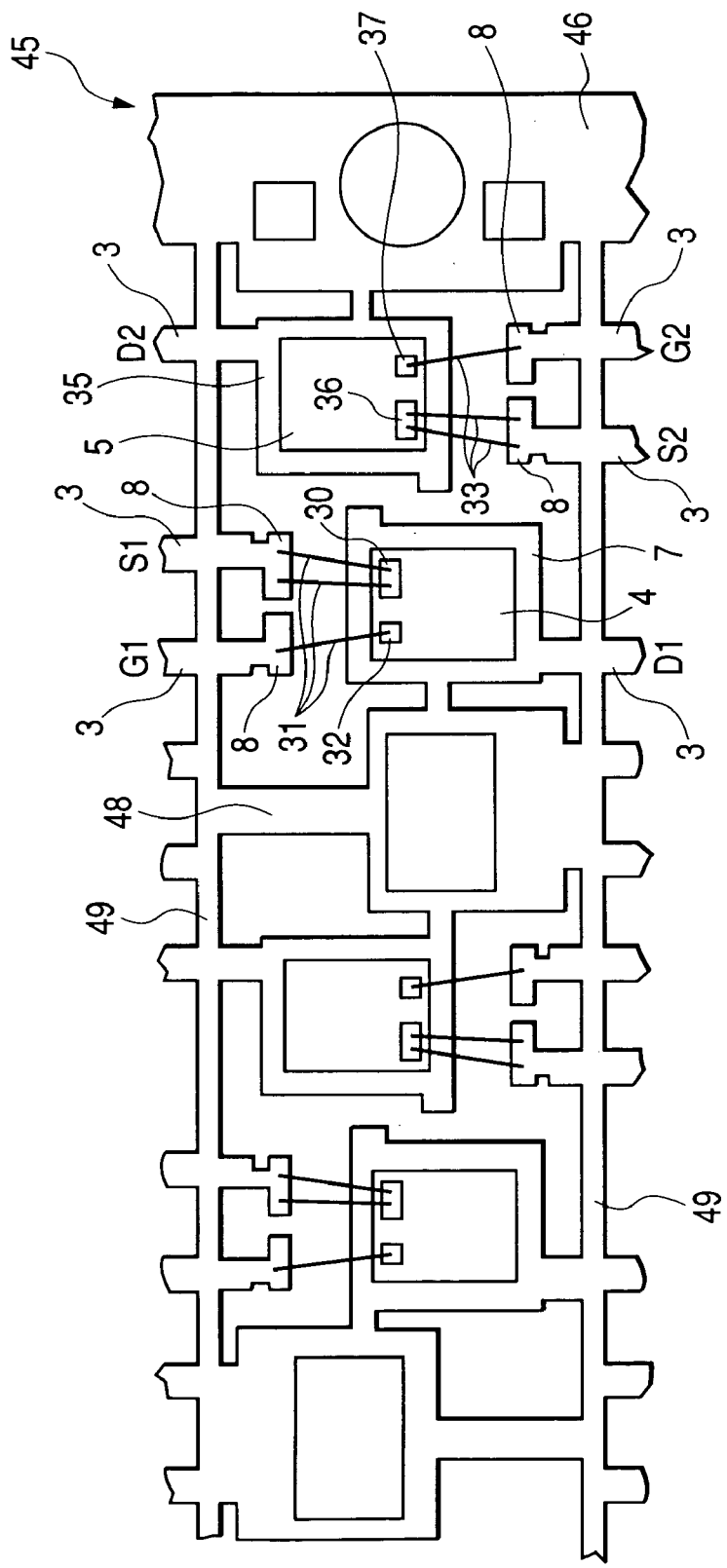
FIG. 12 is a plan view to show a portion of a lead frame in which chip bonding and wire bonding are finished in the manufacturing of the semiconductor device.

The lead frame 45 like this is prepared and then, as shown in FIG. 12, the semiconductor chip 4 is located on and fixed to the semiconductor chip fixing part 7 with the Ag paste and the semiconductor chip 5 is located on and fixed to the semiconductor chip fixing part 35 with the Ag paste. After fixing, the Ag paste is subjected to a baking treatment, thereby being hardened.

Next, as shown in FIG. 12, in the semiconductor chip 4, the gate electrode pad 32 is connected to the wire bonding pad 8 of the gate lead G1 with a wire 31 and the source electrode pad 30 is connected to the wire bonding pad 8 of the source lead S1 with wires 31. Further, in the semiconductor chip 5, the gate electrode pad 37 is connected to the wire bonding pad 8 of the gate lead G2 with a wire 31 and the source electrode pad 36 is connected to the wire bonding pad 8 of the source lead S2 with wires 31.

Figure 13:
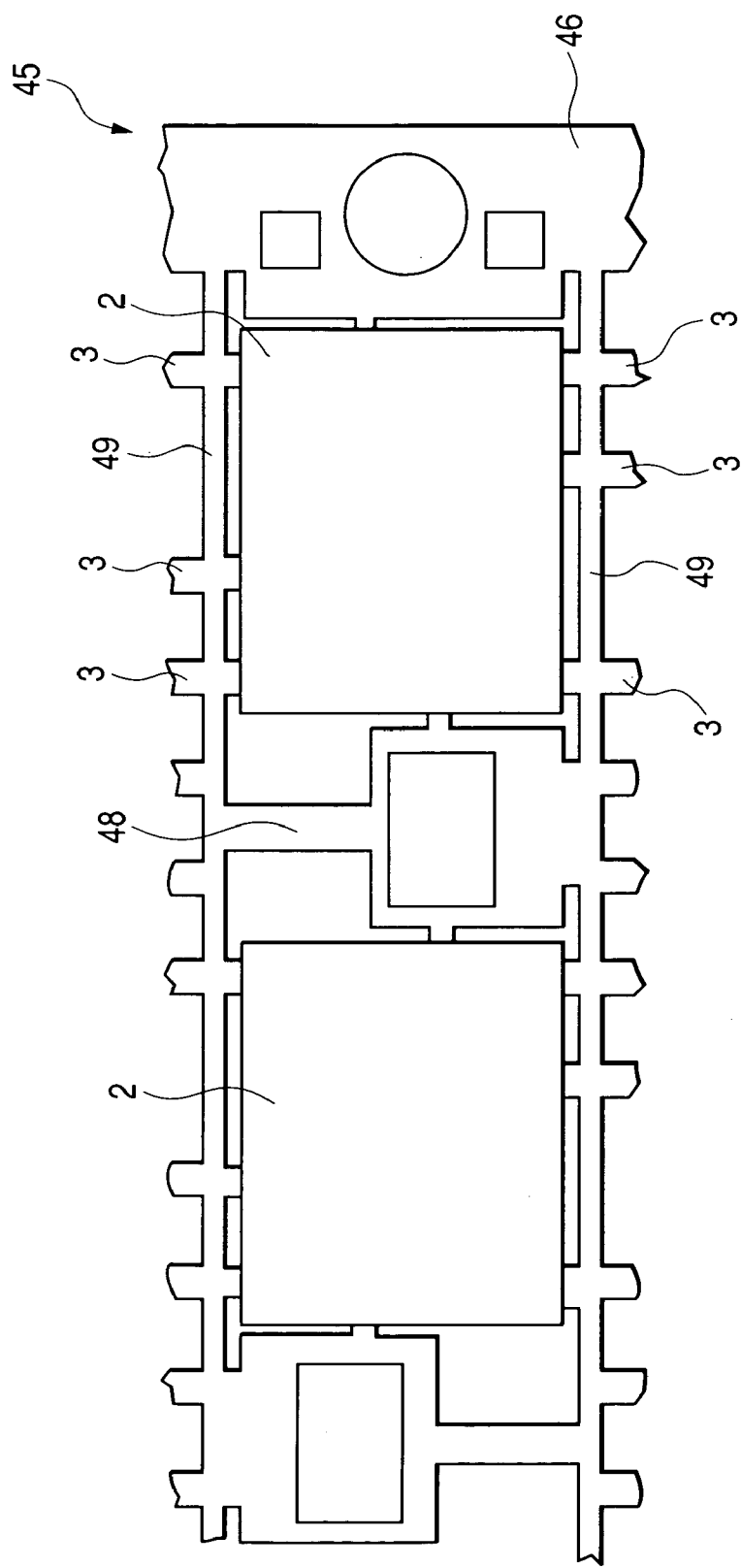
FIG. 13 is a plan view to show a portion of a lead frame on which a package is formed in the manufacturing of the semiconductor device.
Figure 14:
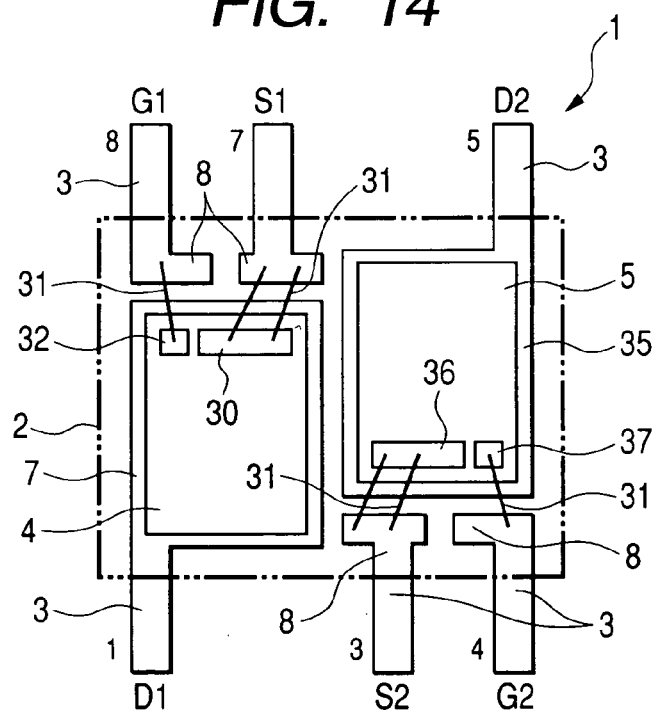
FIG. 14 is a schematic plan view to show in a transparent state a semiconductor chip fixing parts and the like in a package in a semiconductor device of a modification of embodiment 1.

Next, as shown in FIG. 13, the package 2 is formed by the transfer molding. The package 2 is formed in such a way as to cover the top and bottom surfaces of the lead frame 45. The package 2 covers the semiconductor chips 4, 5, the semiconductor chip fixing parts 7, 35, the inner end portions of the leads 3, and the wires 31.

Next, the unnecessary portions of the lead frame are cut and removed and the leads 3 are cut at predetermined positions and the leads 3 protruding from the sides of the package 2 are formed in the shape of gull wings to form the semiconductor device 1 shown in FIGS. 2 to 5.

FIG. 14 is a schematic view to show the semiconductor device 1 that is a modification of this embodiment 1. This modification has a structure in which the sides opposite to each other of the semiconductor chip fixing part 7 and the semiconductor chip fixing part 35 extend linearly in parallel. A gap between the semiconductor chip fixing part 7 and the gate lead G1 and the source lead S1 is 0.2 mm and a gap between the semiconductor chip fixing part 35 and the source lead S2 and the gate lead G2 is also 0.2 mm. Further, a gap between the semiconductor chip fixing part 7 and the semiconductor chip fixing part 35 is also 0.2 mm. Since this modification has a toothless structure, the semiconductor device 1 has a breakdown voltage of 300 V or more and 600 V.

According to this embodiment 1, the following advantages are provided.
(1) The semiconductor device has a structure in which the drain lead D1 of the first semiconductor chip 4 protrudes from the second surface of the package 2 and in which the drain lead D2 of the second semiconductor chip 5 protrudes from the first surface which is a surface opposite to the second surface of the package 2. Further, a lead is not arranged at the position which is located between the source lead S1 of the first semiconductor chip 4 and the drain lead D2 of the second semiconductor chip 5 of the package 2 and in which a lead terminal 6 is to be arranged, so that a gap between the source lead S1 and the drain lead D2 is as wide as 2.12 mm. Still further, a lead is not arranged at the position which is located between the drain lead D1 of the first semiconductor chip 4 and the source lead S2 of the second semiconductor chip 5 and in which a lead terminal 2 is to be arranged, so that a gap between the drain lead D1 and the source lead S2 is as wide as 2.12 mm. With this, it is possible to prevent a short circuit from developing across the leads and hence to increase the breakdown voltage of the transistor formed on the first and second semiconductor chips 4, 5. For example, it is possible to make the breakdown voltage across the source and drain between the neighboring transistors of the semiconductor device 1 as large as the vicinity of 600 V.

(2) A gap between the semiconductor chip fixing part and the tips of the respective leads whose tips face the semiconductor chip fixing part is as wide as from 0.3 mm to 0.7 mm, so that the breakdown voltage of the resin filled into the gap and forming the package is increased, which results in providing a semiconductor device having a high dielectric strength. While the dielectric strength varies depending on measurement methods, taking one example, in a case where resin such as epoxy resin exists between the leads, the dielectric strength of the resin is 15,000 V/mm. Further, in a case where air exists between the leads, the dielectric strength of the air is 3,000 V/mm. Hence, in the case of this embodiment 1, the resin exists in a thickness of from 0.3 mm to 0.7 mm between the leads and hence the resin has a high dielectric strength far higher than 600 V and, even taking a factor of safety into account, there is provided a highly dielectric excellent product.

(3) Since the semiconductor device of this embodiment 1 is different from a conventional semiconductor device only in a portion of a lead frame pattern, the semiconductor device 1 of this embodiment 1 can be produced only by changing a cutting die of a press machine in a currently used line of an apparatus for manufacturing a conventional semiconductor device. Hence, it is possible to produce the semiconductor device in volume while reducing the amount of investment and hence to reduce product cost.

[Embodiment 2]

Figure 15:
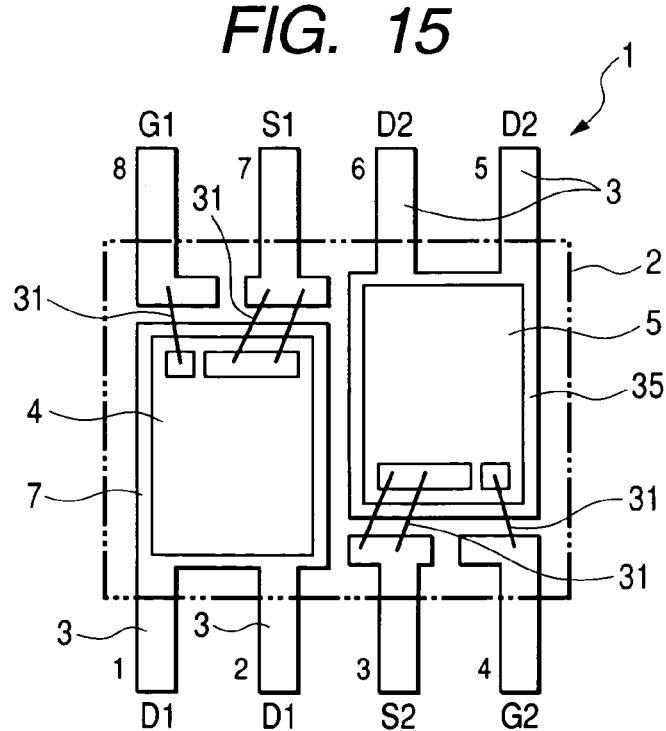
FIG. 15 is a schematic plan view to show in a transparent state semiconductor chip fixing parts and inner leads in a package in a semiconductor device of embodiment 2 of the invention.

FIG. 15 is a schematic view to show a semiconductor device of the embodiment 2 of the invention. FIG. 15 is a schematic plan view to show in a transparent state the semiconductor chip fixing part, inner leads and the like in the package.

The embodiment 2 is such that the leads 3 are arranged also at the positions of a lead terminal 2 and a lead terminal 6 in the semiconductor device 1 of the modification of the embodiment 1. That is, in the 4th lead arranged at the position of the lead terminal 2, the tip portion (inner end portion) located in the package 2 is connected to the semiconductor chip fixing part 7 to form a drain lead D1. Further, in the 8th lead arranged at the position of the lead terminal 6, the tip portion (inner end portion) located in the package 2 is connected to the semiconductor chip fixing part 35 to form a drain lead D2.

In the semiconductor device 1 of this embodiment 2, the gap between the neighboring drain lead D1 and the source lead S2 and the gap between the neighboring drain lead D2 and the source lead S1 are 0.87 mm, respectively. Further, all of the gap between the semiconductor chip fixing part 7 and gate lead G1 and the source lead S1, the gap between the semiconductor chip fixing part 35 and gate lead G2 and the source lead S2, and the gap between the semiconductor chip fixing part 7 and the semiconductor chip fixing part 35 are 0.2 mm. As a result, it is possible to make the semiconductor device 1 of the embodiment 2 a highly dielectric product whose upper dielectric strength is close to 300 V. The molding die, cutting die, and forming die of a SOP8 which is a standard outside shape can be used in the manufacturing of this package.

[Embodiment 3]

Figure 16:
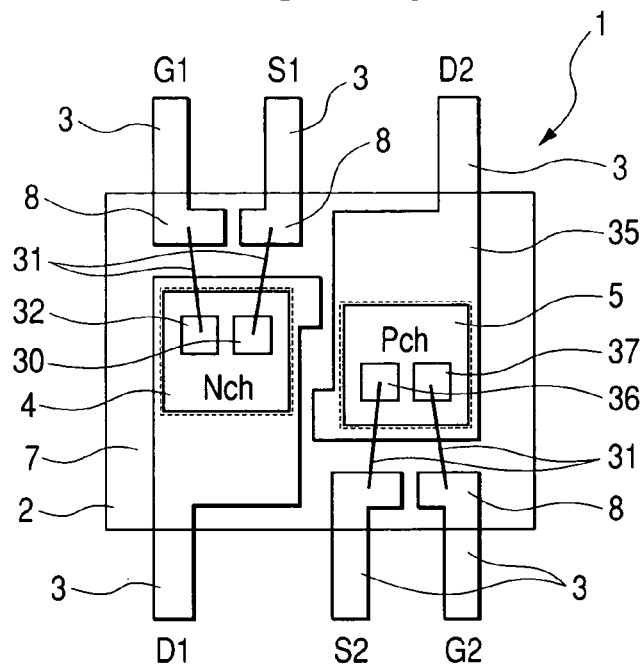
FIG. 16 is a schematic plan view to show in a transparent state semiconductor chip fixing parts and inner leads in a package in a semiconductor device of embodiment 3 of the invention.
Figure 17:
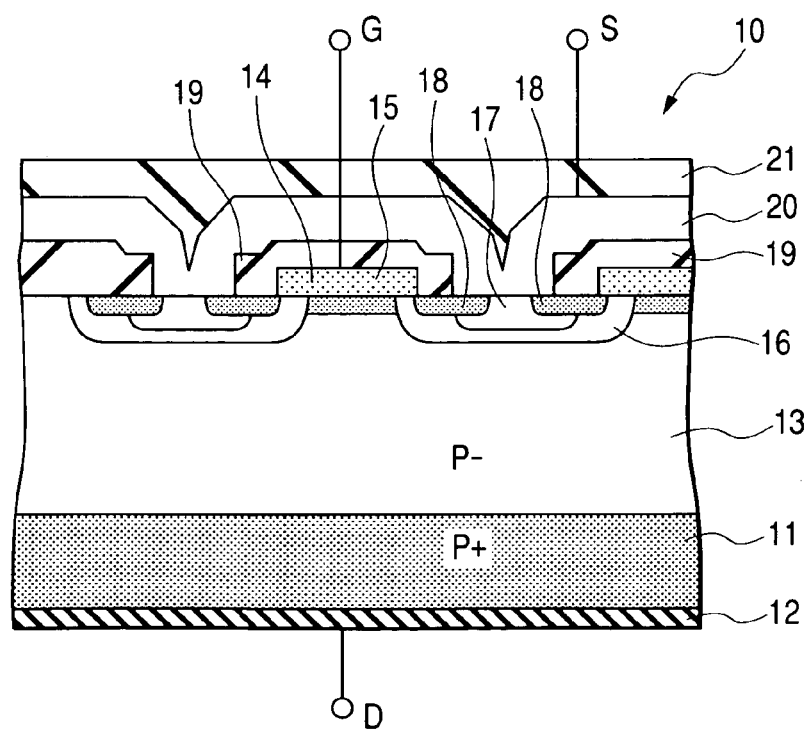
FIG. 17 is a schematic enlarged sectional view to show a portion of a semiconductor chip used for the semiconductor device of embodiment 3 of the invention.

FIG. 16 and FIG. 17 are illustrations related to a semiconductor device of embodiment 3 of the invention. FIG. 16 is a schematic plan view to show in a transparent state the semiconductor chip fixing part and inner leads in the package in the semiconductor device. FIG. 17 is a schematic enlarged sectional view to show a portion of a semiconductor chip used for the semiconductor device.

In the semiconductor device 1 of the embodiment 1, the transistors of the semiconductor chips 4, 5 are N-channel type vertical MOSFET. In the semiconductor device 1 of this embodiment 3, the transistor of the semiconductor chip 4 is an N-channel type vertical MOSFET (Nch) and the other structure is the same as the semiconductor device 1 of the embodiment 1 except that the transistor of the semiconductor chip 5 is a P-channel type vertical MOSFET.

FIG. 17 shows an illustration to show the cell portion of the P-channel type vertical MOSFET. The P-channel type vertical MOSFET has the same structure as the N-channel type vertical MOSFET shown in FIG. 7 except that the conduction type of a semiconductor layer (semiconductor region) is changed to an opposite conduction type. That is, the semiconductor board 11 is a P-type silicon board and the epitaxial layer 13 is a P type and the low impurity concentration layer 16 is an N type and the high impurity concentration layer 17 is an N$^+$ type and the source region 18 is a P$^+$ type. The low impurity concentration region 16 becomes a channel layer (base layer). With this, there is provided a P-channel type vertical MOSFET.

The semiconductor device 1 of this embodiment 3 has a construction having the N-channel type vertical MOSFET and the P-channel type vertical MOSFET. This can provide an advantage that two FETs can be controlled by a simple drive circuit.

[Embodiment 4]

Figure 18:
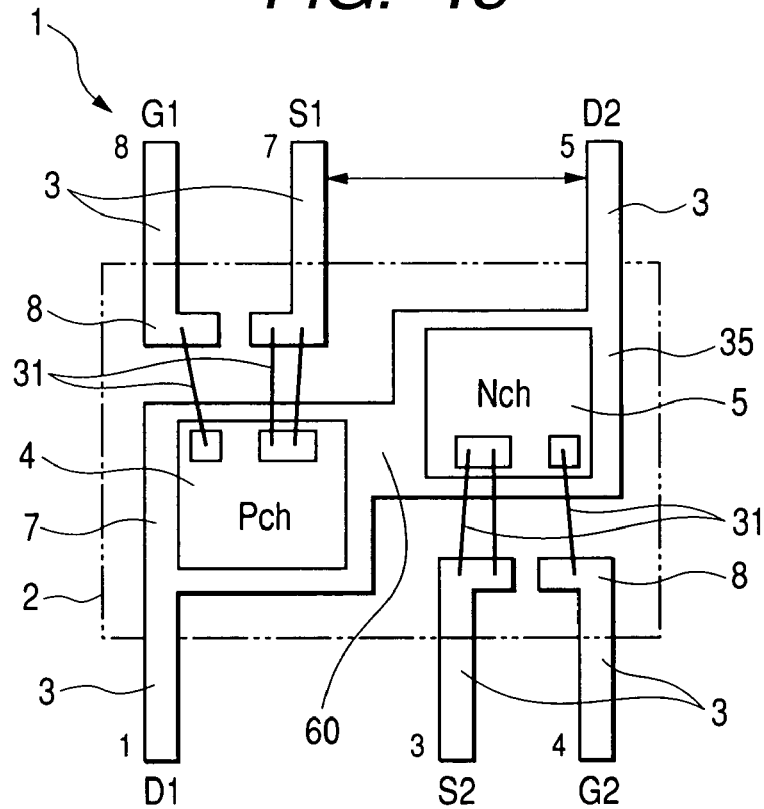
FIG. 18 is a schematic plan view to show in a transparent state semiconductor chip fixing parts and inner leads in a package in a semiconductor device of embodiment 4 of the invention.
Figure 19:
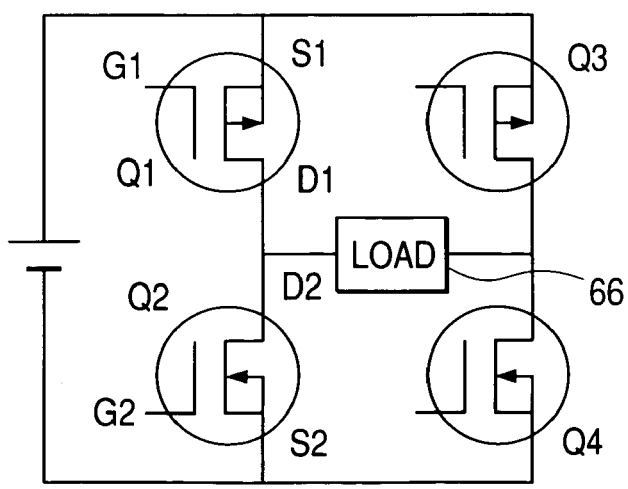
FIG. 19 is a bridge circuit diagram of an electronic device in which a semiconductor device of embodiment 4 is built.

FIG. 18 and FIG. 19 are illustrations related to a semiconductor device of embodiment 4 of the invention. FIG. 18 is a schematic plan view to show in a transparent state the semiconductor chip fixing part and inner leads in the package in the semiconductor device. FIG. 19 is a bridge circuit of an electronic device in which the semiconductor device of the embodiment 4 is built.

The semiconductor device 1 of this embodiment 4 is different from the semiconductor device 1 of the embodiment 1 in a structure that the semiconductor chip fixing part 7 is connected to the semiconductor chip fixing part 35 by a connection part 60. Further, another different point is that the semiconductor chip 4 made of the P-channel type vertical MOSFET (Pch) is fixed on the semiconductor chip fixing part 7 and that the semiconductor chip 5 made of the N-channel type vertical MOSFET (Nch) is fixed on the semiconductor chip fixing part 35. The other portions are the same as those in the semiconductor device 1 of the embodiment 1.

The semiconductor device 1 like this can be used for the full bridge circuit of an electronic device shown in FIG. 19. In this full bridge circuit, four transistors Q1 to Q4 are used. In this circuit, generally, a load 66 is controlled by a longitudinal combination of Q1+Q2, or Q3+Q4. In this case, terminals across which high voltage (100 V or more) is not placed are G1-S1, G2-S2, and D1-D2. The high voltage is placed across the other terminals. Hence, the semiconductor device 1 of this embodiment 4 can be used for the longitudinal connection circuit portion of the transistors Q1 and Q2. The connection of the drain lead D1 to the drain lead D2 is realized by integrating the semiconductor chip fixing part 7 with the semiconductor chip fixing part 35 through the connection part 60 in the package 2. This circuit can be suitably used for, for example, a switching power source. FIG. 19 shows the full bridge circuit and the semiconductor device 1 of this embodiment 4 can be used also for a circuit of half bridge construction.

Figure 20A:
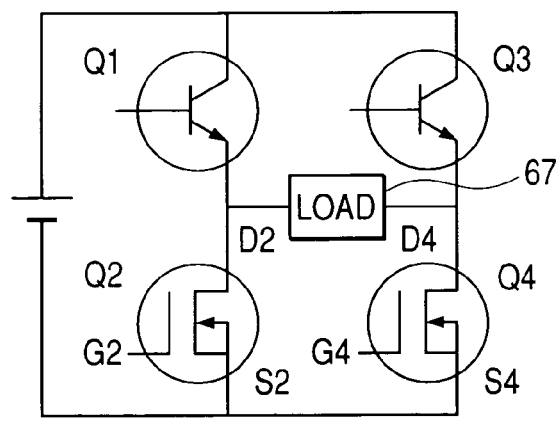
FIGS. 20A, 20B, and 20C are circuit diagrams to show examples of a bridge circuit of an electronic device in which a semiconductor device in accordance with the invention can be built.
Figure 20B:
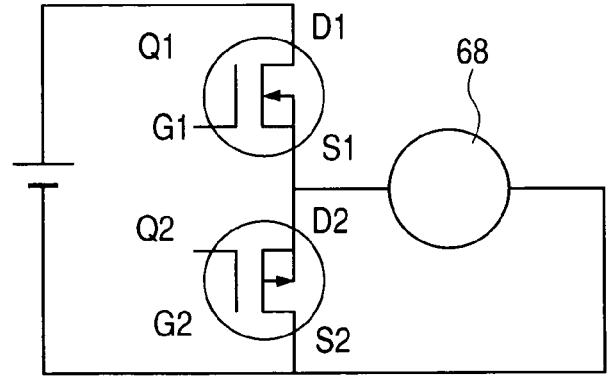
Figure 20C:
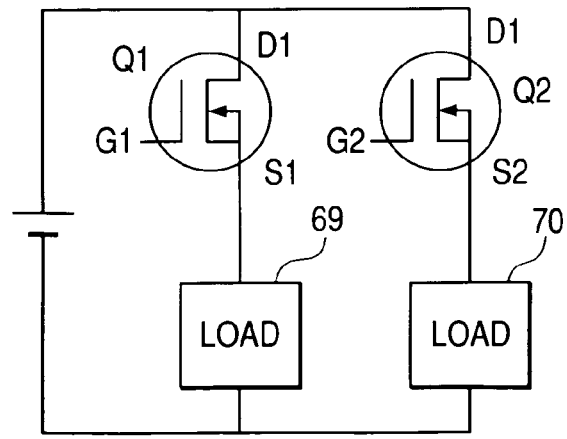
Figure 21:
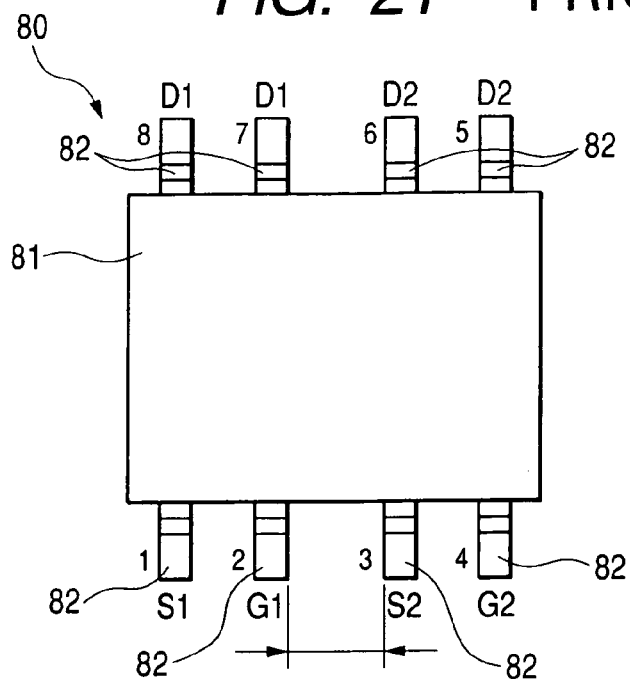
FIG. 21 is a schematic plan view of a conventional semiconductor device.
Figure 22:
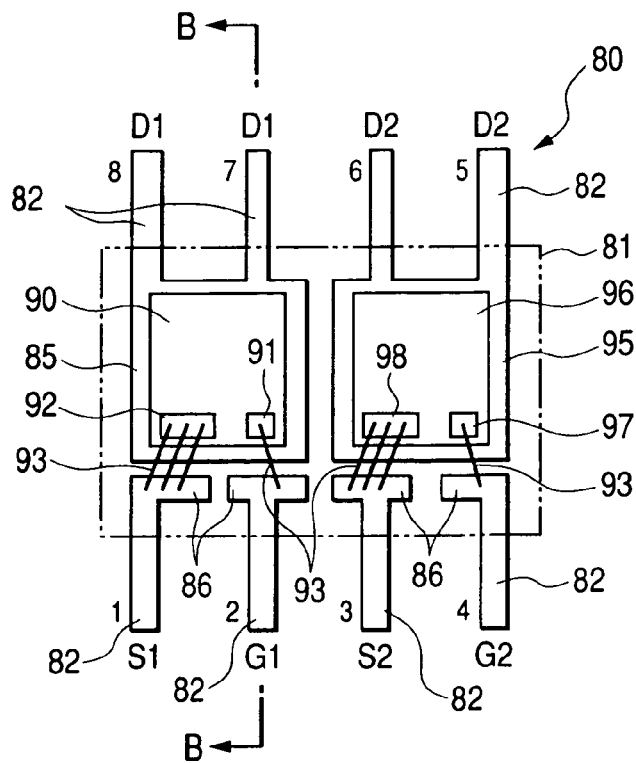
FIG. 22 is a schematic plan view to show in a transparent state semiconductor chip fixing parts and inner leads in a package in a conventional semiconductor device.
Figure 23:
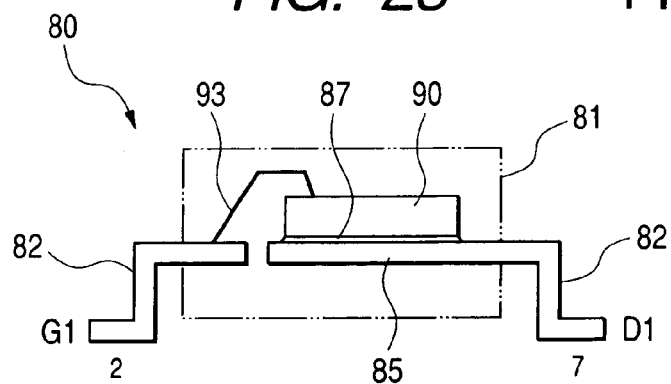
FIG. 23 is a schematic sectional view along a line B—B in FIG. 22.
Figure 24:
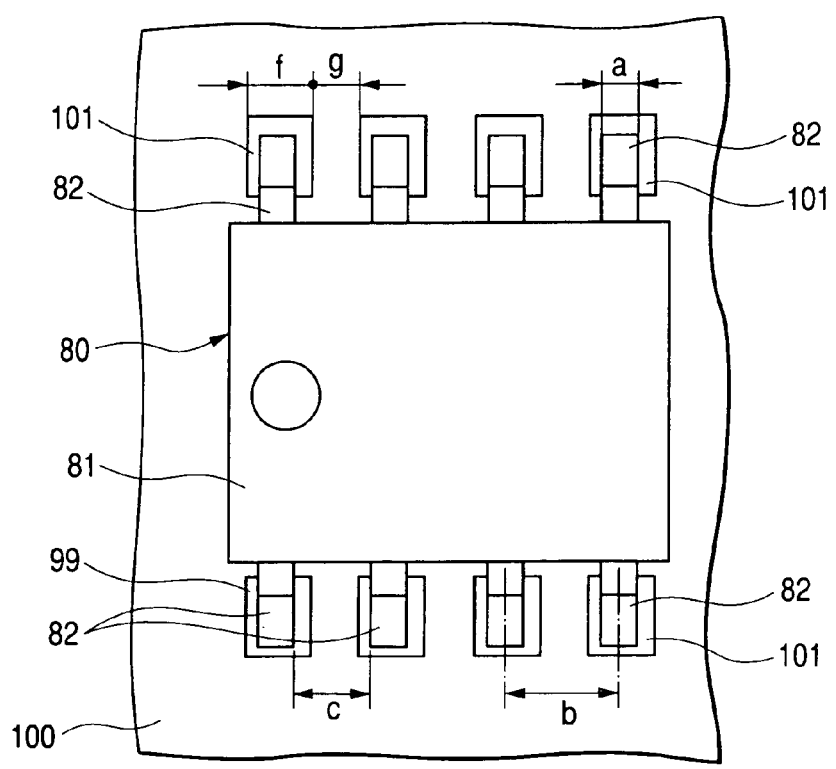
FIG. 24 is a schematic plan view to show a state where a conventional semiconductor device is mounted on a mounting board.

The semiconductor device related to the invention in which two transistors are built in a single package 2 can be used also for the other circuit of the electronic device by the selection of the transistors to be built-in and the way of connection of the transistors. FIG. 20 shows circuit examples to which the semiconductor device of the invention can be applied.

FIG. 20(*a*) is a full bridge circuit including the transistors Q1 to Q4, and Q1 and Q3 are bipolar transistors, and Q2 and Q4 are the N-channel type vertical MOSFETs, and a lateral combination of Q2+Q4 is constructed of the semiconductor devices 1 of this embodiment. A load 67 is controlled by the transistors of longitudinal combinations of Q1+Q2 and Q3+Q4. In this case, the terminals across which high voltage (100 V or more) is not placed are G1-S2 and G2-S2 and the high voltage is placed across the terminals D2–D4 and across the other terminals. This circuit can be suitably used for, for example, a liquid crystal back light inverter. FIG. 20(*a*) shows a full bridge circuit and the semiconductor device 1 of this embodiment 4 can be used also for a circuit of half bridge construction.

FIG. 20(*b*) is a circuit using the transistors Q1 and Q2. The transistor Q1 is an N-channel type vertical MOSFET and the transistor Q2 is a P-channel type vertical MOSFET. The lateral combination of Q1+Q2 is constructed of the semiconductor device 1 of this embodiment. A lamp (load) 68 like a fluorescent lamp is operated by the lateral combination of Q1+Q2. In this case, the terminals across which high voltage (100 V or more) is not placed are G1-S1, G2-S2, and S1-D2 and the high voltage is placed across the other terminals. This circuit is a source common connection and can be suitably used for, for example, an inverter (self-excited type) for a bulb type fluorescent lamp.

FIG. 20(*c*) is a circuit using the transistors Q1 and Q2. Both of the transistors Q1 and Q2 are N-channel type vertical MOSFETs. The lateral combination of Q1+Q2 is constructed of the semiconductor device 1 of this embodiment. Loads 69, 70 are operated by the transistors Q1, Q2, respectively. In this case, the terminals across which high voltage (100 V or more) is not placed are G1-S1, G2-S2, and S1-D2 and the high voltage is placed across the other terminals. This circuit is a switching connection and can be suitably used for, for example, a selector switch of various kinds of electronic devices.

Up to this point, the invention made by the inventor has been concretely described on the basis of the embodiments. However, the invention is not limited to the above-described embodiments but, needless to say, can be changed or modified variously within a scope not departing from the spirit of the invention.

What is claimed is:

1. A semiconductor device comprising:
  a first and a second semiconductor device each including a first conduction type channel field effect transistor having a gate electrode, a source electrode, and a drain electrode;
  a gate lead, a source lead, and a drain lead that are electrically connected respectively to a gate electrode, a source electrode, and a drain electrode of each of the first and the second semiconductor device; and
  a package that packages the first and the second semiconductor device and portions of the plurality of leads, wherein the package has a top surface, a bottom surface opposite to the top surface, a first side surface, and a second side surface opposite to the first side surface, wherein the gate lead and the source lead electrically connected to the gate electrode and the source electrode of the first semiconductor chip protrude from the first side surface of the package, wherein the drain lead electrically connected to the drain electrode of the first semiconductor chip protrude from the second side surface of the package, wherein the gate lead and the source lead electrically connected to the gate electrode and the source electrode of the second semiconductor chip protrude from the second side surface of the package, and wherein the drain lead electrically connected to the drain electrode of the second semiconductor chip protrude from the first side surface of the package.

2. The semiconductor device as claimed in claim 1, wherein a gap between the drain lead electrically connected to the drain electrode of the first semiconductor chip and the source lead electrically connected to the source electrode of the second semiconductor chip is wider than a gap between the source lead electrically connected to the source electrode of the second semiconductor chip and the gate lead electrically connected to the gate electrode of the second semiconductor chip, and wherein a gap between the drain lead electrically connected to the drain electrode of the second semiconductor chip and the source lead electrically connected to the source electrode of the first semiconductor chip is wider than a gap between the source lead electrically connected to the source electrode of the first semiconductor chip and the gate lead electrically connected to the gate electrode of the first semiconductor chip.

3. The semiconductor device as claimed in claim 2, wherein in the first side surface of the package, the gate lead electrically connected to the gate electrode of the first semiconductor chip is arranged outside the source lead electrically connected to the source electrode of the first semiconductor device.

4. The semiconductor device as claimed in claim 3, wherein the package further includes a first and a second semiconductor chip mounting part for mounting the first and the second semiconductor chip respectively, the first and the second semiconductor chip mounting part being integrally formed with the drain leads, respectively.

5. The semiconductor device as claimed in claim 4, wherein the gate electrode and the source electrode are formed on top surfaces of the first and the second semiconductor chip and wherein the drain electrode is formed on the bottom surfaces of the first and the second semiconductor chip, the bottom surfaces of the first and the second semiconductor chip being fixed to the first and the second chip mounting part, respectively.

6. The semiconductor device as claimed in claim 5, wherein the gate electrode and the source electrode of each of the first and the second semiconductor chip are connected to the gate lead and the source lead via conductive wires, respectively.

7. The semiconductor device as claimed in claim 6, wherein the first and the second semiconductor chip mounting part are separated from each other in the package.

8. The semiconductor device as claimed in claim 7, wherein the first conduction type is an N type.

9. A semiconductor device comprising:
  a first semiconductor chip that includes a transistor;

a second semiconductor chip that includes a transistor;
a package that packages the first and the second semiconductor device;
a first lead that is electrically connected to a first electrode on a top surface of the first semiconductor chip and protrudes from a first surface of a side surface of the package;
a second lead that is electrically connected to a control electrode on a top surface of the first semiconductor chip and protrudes from the first surface of the package and is adjacent to the first lead;
a third lead that is electrically connected to a second electrode on a bottom surface of an opposite surface of the top surface of the first semiconductor chip and protrudes from a second surface opposite to the first surface;
a fifth lead that is electrically connected to a first electrode on a top surface of the second semiconductor chip and protrudes from the second surface of the package;
a sixth lead that is electrically connected to a control electrode on the top of the second semiconductor chip and protrudes from the second surface of the package and is adjacent to a fourth lead; and
a seventh lead that is electrically connected to a second electrode on a bottom surface of an opposite surface of the top surface of the second semiconductor chip and protrudes from the first surface of the package,
wherein arrangement positions of lead terminals 1 to 4 where four leads are arranged at predetermined intervals are thought on the first surface of the package, and
wherein arrangement positions of lead terminals 8 to 5 arranged opposite to the lead terminals 1 to 4 are thought on the second surface of the package, the third lead being located at the lead terminal 1,
the fifth lead being located at the lead terminal 3,
the sixth lead being located at the lead terminal 4,
the seventh lead being located at the lead terminal 5,
the first lead being located at the lead terminal 7,
the second lead being located at the lead terminal 8.

10. The semiconductor device as claimed in claim 9, wherein a portion located in the package of the third lead is connected to a semiconductor chip fixing part on which the first semiconductor chip is mounted and which has a large area, wherein tips of the first lead and the second lead face a periphery of the semiconductor chip fixing part, wherein a portion located in the package of the seventh lead is connected to a semiconductor chip fixing part on which the second semiconductor chip is mounted and which has a large area, wherein tips of the fifth lead and the sixth lead face the periphery of the semiconductor chip fixing part.

11. The semiconductor device as claimed in claim 9,
further comprising the third lead located at the lead terminal 1 and the fourth lead located at a lead terminal 2, wherein the third lead and the fourth lead are connected to a semiconductor chip fixing part on which the first semiconductor chip is mounted and which has a large area, and wherein tips of the first lead and the second lead face a periphery of the semiconductor chip fixing part,
further comprising the seventh lead located at the lead terminal 5 and the eighth lead located at a lead terminal 6, wherein the seventh lead and the eighth lead are connected to a semiconductor chip fixing part on which the second semiconductor chip is mounted and which has a large area, and wherein tips of the fifth lead and the sixth lead face the periphery of the semiconductor chip fixing part.

12. The semiconductor device as claimed in claim 2, wherein a gap between the semiconductor chip fixing part and the respective leads whose tips face the semiconductor chip fixing part is as wide as from 0.3 mm to 0.7 mm.

13. The semiconductor device as claimed in claim 9, wherein the first electrode of the first semiconductor chip is connected to the first lead by a conductive wire, wherein the control electrode of the first semiconductor chip is connected to the second lead by a conductive wire, wherein the first electrode of the second semiconductor chip is connected to the fifth lead by a conductive wire, and wherein the control electrode of the first semiconductor chip is connected to the sixth lead by a conductive wire.

14. The semiconductor device as claimed in claim 9, wherein a power field effect transistor is formed on each of the first semiconductor chip and the second semiconductor chip, and wherein in the power field effect transistor, the first electrode is a source electrode and the second electrode is a drain electrode and the control electrode is a gate electrode.

15. The semiconductor device as claimed in claim 9, wherein the leads protruding from the first surface and the second surface of the package are formed in a shape of gull wings.

16. An electronic device comprising:
a transistor Q1 and a transistor Q2 that are connected in series to a power source;
a transistor Q3 and a transistor Q4 that are connected in series to the power source; and
a load connected to a connection point of the transistors Q1 and Q2 and a connection point of the transistors Q3 and Q4, wherein the transistors from Q1 to Q4 are N-channel type power MOSFETs, and
wherein the transistors Q1 and Q2 are formed of the semiconductor device as claimed in claim 1.

17. An electronic device comprising:
a transistor Q1 and a transistor Q2 that are connected in series to a power source;
a transistor Q3 and a transistor Q4 that are connected in series to the power source; and
a load controlled by an output signal by the transistors Q1 and Q2 and an output signal by the transistors Q3 and Q4,
a load connected to a connection point of the transistors Q1 and Q2 and a connection point of the transistors Q3 and Q4, wherein the transistors Q1 and Q3 are P-channel type power MOSFETs,
wherein the transistors Q2 and Q4 are N-channel type power MOSFETs, and
wherein the transistors Q1 and Q2 are formed of the semiconductor device as claimed in claim 1.

18. An electronic device comprising:
a transistor Q1 and a transistor Q2 that are connected in series to a power source;
a transistor Q3 and a transistor Q4 that are connected in series to the power source; and
a load connected to a connection point of the transistors Q1 and Q2 and a connection point of the transistors Q3 and Q4, wherein the transistors Q1 and Q3 are NPN type bipolar transistors,
wherein the transistors Q2 and Q4 are N-channel type power MOSFETs, and
wherein the transistors Q2 and Q4 are formed of the semiconductor device as claimed in claim 1.

19. An electronic device comprising:

an N-channel type power MOSFET Q1 and a P-channel type power MOSFET Q2 that are connected in series to a power source; and a load connected to a connection point of the transistors Q1 and Q2 and the transistor Q2, wherein the transistors Q1 and Q2 are formed of the semiconductor device as claimed in claim 1.

20. An electronic device comprising:

an N-channel type power MOSFET Q1 and a load that are connected in series to a power source; and an N-channel type power MOSFET Q2 and a load that are connected in series to the power source;

wherein the transistors Q1 and Q2 are formed of the semiconductor device as claimed in claim 1.

* * * * *